United States Patent
Duchesne et al.

(10) Patent No.: US 7,740,713 B2
(45) Date of Patent: Jun. 22, 2010

(54) FLUX COMPOSITION AND TECHNIQUES FOR USE THEREOF

(75) Inventors: Eric Duchesne, Granby (CA); Michael Gaynes, Vestal, NY (US); Timothy A. Gosselin, Tempe, AZ (US); Kang-Wook Lee, Yorktown Heights, NY (US); Valerie Oberson, St-Alphonse de Granby (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/834,293

(22) Filed: Apr. 28, 2004

(65) Prior Publication Data

US 2005/0241731 A1    Nov. 3, 2005

(51) Int. Cl.
*B23K 35/34* (2006.01)
(52) U.S. Cl. .............. 148/23; 148/24; 148/25
(58) Field of Classification Search .......... 148/24, 148/23, 25
See application file for complete search history.

(56) References Cited

U.S. PATENT DOCUMENTS

| | | | |
|---|---|---|---|
| 4,000,016 A | 12/1976 | Lazzarini et al. | 148/23 |
| 4,168,996 A * | 9/1979 | Zado | 148/23 |
| 4,762,573 A | 8/1988 | Biverstedt | 148/23 |
| 5,004,509 A * | 4/1991 | Bristol | 148/23 |
| 5,011,546 A * | 4/1991 | Frazier et al. | 148/23 |
| 5,074,928 A * | 12/1991 | Sanji et al. | 148/23 |
| 5,122,201 A * | 6/1992 | Frazier et al. | 148/23 |
| 5,177,134 A * | 1/1993 | Mullen et al. | 524/284 |
| 5,297,721 A * | 3/1994 | Schneider et al. | 228/180.1 |
| 5,450,666 A | 9/1995 | Conn et al. | 29/890.043 |
| 5,615,827 A | 4/1997 | Arldt et al. | 228/223 |
| 6,550,667 B2 * | 4/2003 | Bernier et al. | 228/207 |
| 6,599,372 B2 * | 7/2003 | Arora et al. | 148/23 |
| 2001/0042775 A1* | 11/2001 | Arora et al. | 228/180.1 |
| 2003/0141351 A1* | 7/2003 | Akaike et al. | 228/207 |
| 2004/0129344 A1* | 7/2004 | Arita et al. | 148/23 |

* cited by examiner

*Primary Examiner*—Roy King
*Assistant Examiner*—Christopher Kessler
(74) *Attorney, Agent, or Firm*—Ryan, Mason & Lewis, LLP

(57) ABSTRACT

The present invention is directed to soldering techniques and compositions for use therein. In one aspect, a flux composition is provided. The flux composition comprises a fluxing agent comprising organic acid, an organic tacking agent and an organic wetting agent. In another aspect, a soldering method for joining objects is provided comprising the following steps. A flux composition and a solder compound are applied to at least a portion of one or more of the objects. The flux composition comprises a fluxing agent comprising organic acid, an organic tacking agent and an organic wetting agent. The objects are then joined.

30 Claims, 1 Drawing Sheet

FLUX COMPOSITION AND TECHNIQUES FOR USE THEREOF

FIELD OF THE INVENTION

The present invention relates to soldering techniques and, more particularly, to flux compositions and techniques for use thereof.

BACKGROUND OF THE INVENTION

Fluxes play an important role in solder-joining electronic components, such as semiconductor devices, onto printed circuit cards and/or printed circuit boards (PCBs). The use of commonly available fluxes typically results in residues remaining on the soldered components. These residues, which can be difficult to remove, are undesirable as they often lead to short circuits and adhesional failure, for example, at the interface between the semiconductor device and, e.g., an underfill material. Thus, any residues that form should be easily and effectively removable, for example, using water or common cleaning solutions.

Further, many commonly available fluxes, such as those described in U.S. Pat. No. 5,615,827 issued to Arldt et al., cannot be employed in high throughput manufacturing. Namely, the nature of these flux compositions permits components to shift relative to each other when subject to the jostling and vibrations typically encountered during high throughput manufacturing. As a result, misalignment of components can occur.

Certain fluxes have been developed which have a "tackiness" property associated therewith, aimed at preventing such misalignments. However, these fluxes require the use of solvents, such as glycerol-ethoxylate, which undesirably remain liquid after reflow. This remaining liquid flux can further react with the solder, generating additional residues and corroding the solder. Further, the additional residues left by these fluxes cannot be removed with typical washing processes and therefore typically remain, causing short circuiting and delamination at the chip-underfill interface.

Therefore, flux compositions and techniques for the use thereof are needed for high throughput manufacturing, wherein a minimal amount of residue is produced and is easily removable using conventional washing techniques.

SUMMARY OF THE INVENTION

The present invention is directed to soldering techniques and compositions for use therein. In one aspect of the invention, a flux composition is provided. The flux composition comprises a fluxing agent comprising organic acid, an organic tacking agent and an organic wetting agent.

In another aspect of the invention, a soldering method for joining objects is provided comprising the following steps. A flux composition and a solder compound are applied to at least a portion of one or more of the objects. The flux composition comprises a fluxing agent comprising organic acid, an organic tacking agent and an organic wetting agent. The objects are then joined A more complete understanding of the present invention, as well as further features and advantages of the present invention, will be obtained by reference to the following detailed description and drawings.

DETAILED DESCRIPTION OF PREFERRED EMBODIMENTS

Figure 1A:
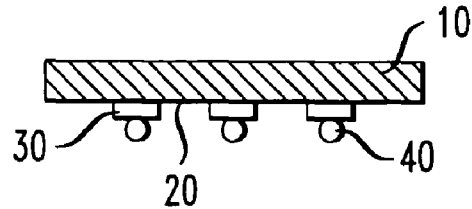
FIGS. 1$a$-$c$ are diagrams illustrating techniques for soldering a semiconductor device to a printed circuit board using a flip-chip configuration according to an embodiment of the present invention.

A flux composition suitable for use in solder-joining, e.g., electrical components, is disclosed herein. The flux composition comprises a fluxing agent comprising organic acid, e.g., as the primary active ingredient. The fluxing agent removes oxidized metals from soldered surfaces, forming the solder bonds. Suitable organic acids include, but are not limited to, dicarboxylic acids having the general formula HOOC$(CH_2)_n$COOH, wherein n=1-7, such as, pimelic acid (HOOC$(CH_2)_5$COOH) (a solid at room temperature having a melting temperature of about 105 degrees Celsius (° C.)), adipic acid (HOOC$(CH_2)_4$COOH), glutaric acid (HOOC$(CH_2)_3$COOH) and combinations comprising at least one of the foregoing dicarboxylic acids. Suitable organic acids further include, but are not limited to, sulfonic acids, methanesulfonic acid, monocarboxylic acids, formic acid, benzoic acid, nitrobenzoic acid, toluic acid (and isomers thereof), halogenated carboxylic acids, such as, chloroacetic acid (ClCH$_2$COOH), dichloroacetic acid (Cl$_2$CHCOOH), bromoacetic acid (BrCH$_2$COOH), dibromoacetic acid (Br$_2$CHCOOH), fluoroacetic acid (FCH$_2$COOH), difluoroacetic acid (F$_2$CHCOOH), chlorobenzoic acid, bromobenzoic acid and combinations comprising at least one of the foregoing organic acids.

The flux composition comprises from about one percent by weight to about ten percent by weight fluxing agent, based on the total weight of the composition. For example, the flux composition may comprise from about two percent by weight to about six percent by weight fluxing agent, based on the total weight of the composition.

In an exemplary embodiment, the flux composition comprises from about one percent by weight to about ten percent by weight pimelic acid and is used to solder-join a semiconductor chip(s) to a printed circuit board (PCB). According to this exemplary embodiment, the flux composition preferably comprises greater than or equal to about two percent by weight pimelic acid in order to provide adequate fluxing action, i.e., effective removal of the oxide layers.

Further, amounts of pimelic acid greater than about ten percent by weight may be undesirable, as such levels may result in excess residues being present at the completion of the solder-joining process. Excess residue formation can cause short circuiting as well as interface adhesional failures. For example, a continuous, or near-continuous, residue layer, e.g., over greater than or equal to about 90 percent of the interface of the solder-joined electrical components, can cause electrical shorts. Whereas, adhesional failures can result from a residue layer covering only ten percent or more of the interface of solder-joined electrical components.

The flux composition further comprises an organic tacking agent to increase the surface tension and viscosity and thus enhance the tackiness of the flux composition. According to the techniques presented herein, the surface tension of the flux composition is preferably from about 40 millinewtons per meter (mN/m) to about 200 mN/m and the viscosity of the flux composition is preferably from about 50 millipascal seconds (mPa·s) to about 500 mPa·s.

The organic tacking agent preferably has a relatively high evaporation temperature, e.g., greater than or equal to about 200° C. Suitable organic tacking agents include, but are not limited to, solvents, such as, glycerol, mannitol, triethanolamine and combinations comprising at least one of the foregoing solvents.

It is preferred that the organic tacking agent evaporates at the reflow temperature of the solder employed, so that no flux solutions are left after the soldering process is completed, leaving essentially only solid washable residues. Therefore, in an exemplary embodiment wherein a lead-free solder is employed, the organic tacking agent completely evaporates at temperatures of from about 200° C. to about 350° C.

The flux composition comprises from about 50 percent by weight to about 99 percent by weight organic tacking agent, based on the total weight of the composition. For example, the flux composition may comprise from about 50 percent by weight to about 70 percent by weight organic tacking agent.

In an exemplary embodiment, the flux composition comprises from about 50 percent by weight to about 99 percent by weight glycerol and is used to solder-join a semiconductor chip(s) to a PCB. According to this exemplary embodiment, the flux composition preferably comprises about 70 percent by weight glycerol. Amounts of glycerol less than about 50 percent by weight are undesirable because the resulting flux composition will not have enough tackiness to sustain high throughput manufacturing. In this particular embodiment, amounts of glycerol greater than about 90 percent by weight are also undesirable because the corresponding flux will not spread well onto chip carrier surfaces and may leave heavy residues across areas of the semiconductor chip surface. In other applications, however, such as those involving solder-joining semiconductor devices to ceramic substrates, amounts of glycerol up to about 99 percent by weight may be desirable.

The flux composition further comprises an organic wetting agent which improves wetting of the solder onto surfaces, thus enhancing the processability and application of the flux composition. The organic wetting agent preferably has a relatively low evaporation temperature, e.g., of from about 80° C. to about 170° C. Suitable organic wetting agents include, but are not limited to, 2-propanol, butoxyethanol (ethylene glycol monobutyl ether), propylene glycol monobutyl ether, propylene glycol monopropyl ether, ethylene glycol monopropyl ether and combinations comprising at least one of the foregoing organic wetting agents.

The organic wetting agent is added, for example, to control the surface tension and viscosity of the flux composition, parameters enhanced by the organic tacking agent as described above, and prevent these parameters from becoming too high. A surface tension and viscosity that are too high can cause dewetting (e.g., the removal of liquidous solder from one or more surfaces). Dewetting can thus lead to incomplete soldered joinings. As described above, the surface tension of the flux composition is preferably from about 40 millinewtons per meter (mN/m) to about 200 mN/m and the viscosity of the flux composition is preferably from about 50 millipascal seconds (mPa·s) to about 500 mPa·s. A surface tension of greater than or equal to about 300 mN/m and a viscosity of greater than or equal to about 900 mPa·s can lead to dewetting.

The flux composition comprises from about one percent by weight to about 45 percent by weight organic wetting agent, based on the total weight of the composition. For example, the flux composition may comprise from about ten percent by weight to about 25 percent by weight organic wetting agent. Amounts of organic wetting agent greater than about 45 percent by weight may be undesirable, as the resulting flux composition would not provide enough tackiness to sustain high throughput manufacturing.

In an exemplary embodiment, the flux composition comprises from about one percent by weight to about 45 percent by weight 2-propanol and/or ethylene glycol monobutyl ether and is used to solder-join a semiconductor chip(s) to a PCB. According to this exemplary embodiment, the amount of 2-propanol and/or ethylene glycol monobutyl ether is preferably between about 20 percent by weight to about 25 percent by weight. In this exemplary embodiment, the flux composition preferably comprises from about ten percent by weight to about 45 percent by weight 2-propanol and/or ethylene glycol monobutyl ether, making it easily spreadable on the appropriate surfaces.

The organic acid, e.g., pimelic acid, the organic tacking agent and the organic wetting agent combine to form a homogeneous solution at ambient conditions. According to the present formulation, when the organic wetting agent, which has a lower evaporation temperature than the organic tacking agent (see above), evaporates, the fluxing agent remains dissolved in the organic tacking agent. Importantly, the flux composition leaves solid washable residues at the completion of the soldering process.

The flux composition may further comprise water, preferably deionized water. The flux composition may comprise up to about five percent by weight water, based on the total weight of the composition. For example, the flux composition may comprise from about one percent by weight to about five percent by weight water. Amounts of water greater than about five percent by weight are undesirable because an excessive amount of residue may result. As above, adhesional failures can result from residue covering at least ten percent of the interface of solder-joined electrical components, and residue covering greater than or equal to about 90 percent of the interface of solder-joined electrical components can cause electrical shorts.

Water provides positively charged ions to accelerate the initiation of fluxing action by the fluxing agent, as well as to inhibit any potential reactions between the fluxing agent and the organic tacking agent. Water further minimizes residue formation and facilitates the removal of oxides from solder surfaces.

In an exemplary embodiment, the flux composition comprises up to about five percent by weight water and is used to solder-join a semiconductor chip(s) to a PCB. According to this exemplary embodiment, the flux composition preferably comprises about two percent by weight water.

The flux composition of the present invention may be prepared using conventional formulation techniques. In an exemplary embodiment, the flux composition is prepared by mixing, shaking and/or stirring six grams (g) of pimelic acid, 22 g of 2-propanol, 70 g of glycerol and two g of deionized water at room temperature (e.g., from about 21° C. to about 23° C.). Although not necessary, the temperature of the solution can be increased to about 50° C. to aid in dissolution of the pimelic acid in the solvents.

Figure 1B:
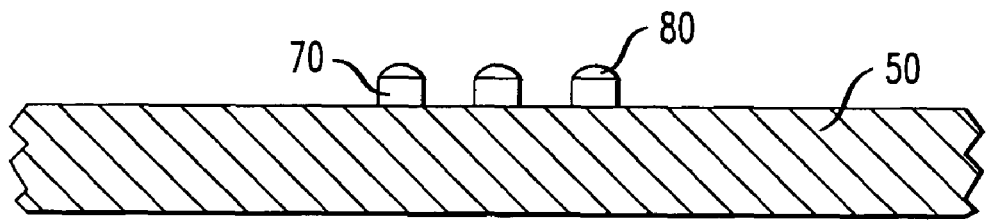
Figure 1C:
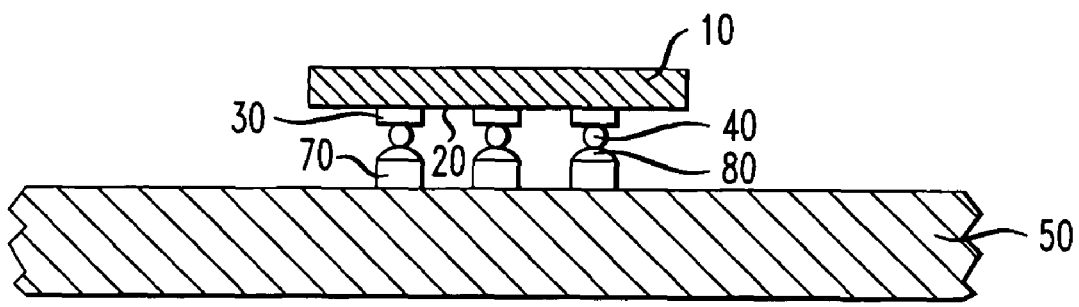

Further disclosed herein are techniques for using the flux composition of the present invention in soldering processes used to join objects, e.g., mount electronic components onto PCBs. FIGS. 1a-c are diagrams illustrating techniques for soldering a semiconductor device to a PCB using a flip-chip configuration. In FIG. 1a, semiconductor chip 10 comprises contact pads 30 on a circuitry-bearing surface 20 of semiconductor chip 10. Solder regions 40 are present on contact pads 30.

While FIG. 1a shows solder regions 40 comprising solder balls, solder regions 40 may comprise any suitable configuration for use in solder-joining techniques, including, but not limited to, solder balls. In an exemplary embodiment, solder regions 40 comprise a solder compound comprising about 37 weight percent lead (Pb) and about 63 weight percent tin (Sn), based on the total weight of the solder composition. As will be described below, in conjunction with the description of FIG. 1b, solder regions 40 may be deposited on contact pads 30 using conventional deposition techniques.

In FIG. 1b, PCB 50 comprises contact pads 70. Solder regions 80 are present on contact pads 70. In a preferred embodiment, solder regions 80 are deposited on contact pads 70 using conventional deposition techniques, including, but not limited to, solder plating, solder stencil printing, molten solder injection and combinations comprising at least one of the foregoing deposition techniques.

As described above, solder regions 80 may comprise solder balls. However, solder regions 80 may comprise any suitable configuration for use in solder-joining techniques, including, but not limited to, solder balls. In an exemplary embodiment, solder regions 80 comprise a solder compound having the same composition as solder regions 40, described above in conjunction with the description of FIG. 1a. Namely, solder regions 80 comprise about 37 weight percent Pb and about 63 weight percent Sn, based on the total weight of the solder composition.

The solder compounds of solder regions 40 and solder regions 80, however, do not have to have the same compositions. For example, the solder compound of solder regions 40 and/or solder regions 80 may comprise about 97 weight percent Pb and about three weight percent Sn, based on the total weight of the solder composition. Further, as will be described in detail below, it may be desirable to eliminate Pb from solder compositions. Accordingly, the solder compound of solder regions 40 and/or solder regions 80 may comprise greater than or equal to about 90 weight percent Sn and up to about ten weight percent of a metal, including, but not limited to, copper (Cu), silver (Ag), nickel (Ni), gold (Au) and combinations comprising at least one of the foregoing metals.

The flux composition of the present invention is applied to solder regions 80 and/or solder regions 40 (described above in conjunction with the description of FIG. 1a). The flux composition may also be applied to contact pads 70 and/or to contact pads 30 (described above in conjunction with the description of FIG. 1a). Application of the flux composition removes oxide layers which have formed on the solder regions and helps achieve increased wetting of the contact pads by the solder. The flux composition may be applied to one or more of these structures using conventional application devices, including, but not limited to, a syringe, a brush, a sprayer, a dipper and combinations comprising at least one of the foregoing application devices.

FIG. 1c shows that after the flux composition of the present invention has been applied, semiconductor chip 10 is positioned relative to PCB 50 such that one or more of solder regions 40 contact one or more of the corresponding solder regions 80. As such, a continuous contact is established from contact pads 30 on semiconductor chip 10 to contact pads 70 on PCB 50.

With solder regions 40 and solder regions 80 in contact with each other, the semiconductor chip 10/PCB 50 assembly is heated to melt at least a portion of solder regions 40 and/or solder regions 80. In an exemplary embodiment, heating is conducted in an oven. During the heating process, the assembly is rapidly heated to a temperature just below the melting temperature of the solder (e.g., a sub-melt temperature). This technique is employed to remove temperature gradients. After a short duration at this sub-melt temperature (typically less than or equal to about two minutes (min)), the assembly is then heated to a temperature of from about 25° C. to about 50° C. above the melting temperature of the solder, to reach a peak reflow temperature. This heating above the melting temperature of the solder helps to ensure that all of the solder reaches a reflow temperature.

For example, a eutectic solder composition, e.g., one comprising about 37 percent Pb and about 63 percent Sn, has a reflow temperature of about 183° C. and thus the peak reflow temperature would be between about 208° C. to about 233° C. Lead-free solders comprising, for example, about 99.3 percent Sn and about 0.7 percent Cu, have a reflow temperature of about 227° C. and those comprising, for example, about 95.5 percent Sn, about 3.8 percent Ag and about 0.7 percent Cu, have a reflow temperature of about 217° C. For these lead-free solders, the peak reflow temperature can be as high as 275° C. The assembly may be kept at the peak reflow temperature for a duration of from about 1.5 min±15 seconds (sec) to about two min±15 sec.

The temperature is then lowered to room temperature. In an exemplary embodiment, the temperature is lowered from the peak reflow temperature at an average rate of about 0.1° C. per sec (as measured from the peak reflow temperature down to 190° C.). As a result of the heating step, solder regions 80 undergo melting and flow around solder regions 40, resulting in continuous metallurgical and electrical connections between semiconductor chip 10 and PCB 50.

Residues may form on surfaces of the assembly, e.g., on the solder-joined regions. These residues typically comprise metallic oxides (e.g., tin oxides ($SnO$, $SnO_2$) in Sn-containing solders) and organics from flux and organometallic compounds that are formed by the reaction between the solder metals and flux components. Washing may be used to remove these residues. Washing may comprise use of a water wash, or first the use of an acid wash followed by a water wash.

The continuous solder connections between semiconductor chip 10 and PCB 50 may then be encapsulated in, for example, an epoxy resin, to relieve any strain which may be caused by a difference between the coefficient of thermal expansion (CTE) of PCB 50 and the CTE of semiconductor chip 10. Encapsulating the connections can be accomplished using conventional techniques.

Since Pb may pose health risks, it may be desirable to reduce or eliminate Pb from electrical components. Thus, certain solder compounds may contain, at most, a limited amount of Pb. The flux composition of the present invention may be used in conjunction with these lead-free solders, especially when the major component of such solder compounds, as is commonly the case, is Sn.

The present flux composition and solder-joining techniques may be employed to mount a pinless chip carrier module, comprising at least one semiconductor chip, e.g., an organic module or a ceramic module, to a PCB. Mounting of such a chip carrier module may be accomplished using techniques similar to the mounting techniques described above.

For example, solder regions may be deposited on contact pads present on a non-chip-bearing surface of the pinless chip carrier module using, e.g., solder stencil printing techniques. Similar solder regions may also optionally be deposited on corresponding contact pads present on the PCB. Stencil printing typically comprises photolithographically etching a stainless steel sheet, e.g., having a thickness of from about 0.003 inches to about 0.010 inches, to define an aperture array corresponding to the contact pad array present, for example, on the chip carrier module. The etched sheet is then aligned with the chip carrier module. The solder compound, typically having the consistency of a paste, is moved across the surface of the etched sheet and pushed into the apertures. The etched sheet may then be removed from the chip carrier module, leaving solder paste on the contact pads.

The present flux composition is then applied to the solder regions on the pinless chip carrier module and/or the solder regions of the PCB. The flux composition may also be applied to contact pads or areas thereof on the pinless chip carrier module and/or the PCB that do not comprise solder regions.

The pinless chip carrier module is then positioned in relation to the PCB such that one or more of the solder regions of the pinless chip carrier module contact one or more of the corresponding solder regions of the PCB. As such, a continuous contact is established from the contact pads of the pinless chip carrier module to the contact pads on the PCB. As above, the pinless chip carrier module/PCB assembly is then heated in order to melt at least a portion of one or more of the solder regions.

According to this embodiment, the magnitude of the difference between the CTE of the pinless chip carrier module and the CTE of the PCB should be minimal, e.g., up to about six parts per million (ppm) per ° C. (ppm/° C.) and from about six ppm/° C. to about 12 ppm/° C. for an organic module and a ceramic module, respectively. Therefore, the resulting connections formed between the pinless chip carrier module and the PCB may or may not be surrounded by an encapsulant.

If the semiconductor component to be mounted onto a PCB is, for example, a pinned chip carrier module, then the present flux composition may be applied to the pins of the chip carrier module and/or to the walls of the (copper) plated through holes (PTHs) in the PCB that correspond to one or more of the pins of the chip carrier module. The flux composition may be applied to one or more of these structures using conventional application techniques, and may be applied prior to the pins being inserted in the PTHs, while the pins are being inserted into the PTHs or after the pins have been inserted into the PTHs.

In an exemplary embodiment, the flux composition is applied to the structures after the pins have been inserted in the PTHs. Namely, the pins are placed in the PTHs forming a chip carrier module/PCB assembly. The assembly is then placed on a conveyor and passed over a fluxing wave or a flux sprayer which serves to introduce the flux composition onto a bottom surface of the PCB. The flux composition is then taken up into the PTHs in the PCB by a wicking action, applying the flux composition to both the walls of the PTHs and to the pins.

The assembly may then be passed over a solder wave that introduces liquid solder onto the same bottom surface of the PCB. The liquid solder is then taken up into the PTHs in the PCB by a similar wicking action, effectively filling the PTHs, and upon cooling and solidification, serving to encircle the pins within the PTHs.

If the semiconductor component to be mounted onto a PCB is, for example, a discrete, passive electronic component, e.g., having leads instead of pins, such as an electrical resistor or capacitor, then techniques similar to those presented above for pinned chip carrier modules may be employed. For example, the leads of the discrete, passive electronic component may be positioned adjacent to the PTHs in the PCB and in contact with the lands encircling the PTHs.

The discrete, passive electronic component/PCB assembly is then passed over a fluxing wave or flux sprayer allowing for the flux composition to be taken up into the PTHs, by a wicking action, and be introduced to the lands encircling the PTHs (and the corresponding leads). Similarly, the assembly is then passed over a solder wave, wherein liquid solder is taken up into the PTHs and introduced to the lands encircling the PTHs (and the corresponding leads).

The present flux composition and solder-joining techniques may be employed to mount other electronic components, including, but not limited to, resistors and capacitors onto a PCB. Further, while the above techniques have been described in the context of solder-joining electrical components, it is to be understood that the present flux composition and techniques for the use thereof are suitable for any applications that involve flux compositions and the use thereof in solder-joining.

Although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. A flux composition, wherein the flux composition leaves a solid washable residue upon completion of a soldering process that can be cleaned with water, comprising:
   a fluxing agent comprising organic acid, wherein the flux composition comprises from about one percent by weight to about ten percent by weight of the fluxing agent, based on the total weight of the composition;
   an organic tacking agent, wherein said organic tacking agent increases the surface tension and viscosity of said flux composition, wherein said viscosity of said flux composition comprises a viscosity value in a range of from about 50 millipascal seconds to about 500 millipascal seconds and said surface tension of said flux composition comprises a surface tension value in a range of about 40 millinewtons per meter to about 200 millinewtons per meter, and wherein the flux composition comprises from about 50 percent by weight to about 99 percent by weight of the organic tacking agent, based on the total weight of the composition;
   an organic wetting agent; and
   water, wherein the water minimizes oxide formation and removes one or more oxides from a solder surface, and wherein the flux composition comprises from about one percent by weight to about five percent by weight water, based on the total weight of the composition.

2. The composition of claim 1, wherein the organic acid comprises a dicarboxylic acid having the formula HOOC(CH$_2$)$_n$COOH, wherein n equals one through seven.

3. The composition of claim 1, wherein the organic acid comprises a dicarboxylic acid selected from the group consisting of pimelic acid, adipic acid, glutaric acid and combinations comprising at least one of the foregoing dicarboxylic acids.

4. The composition of claim 1, wherein the organic acid comprises a halogenated carboxylic acid.

5. The composition of claim 4, wherein the halogenated carboxylic acid is selected from the group consisting of chloroacetic acid, dichloroacetic acid. bromoacetic acid, dibromoacetic acid, fluoroacetic acid, difluoroacetic acid chlorobenzoic acid, bromobenzoic acid and combinations comprising at least one of the foregoing halogenated carboxylic acids.

6. The composition of claim 1, wherein the organic acid comprises a monocarboxylic acid.

7. The composition of claim 6, wherein the monocarboxylic acid is selected from the group consisting of formic acid, benzoic acid, nitrobenzoic acid, toluic acid and combinations comprising at least one of the foregoing monocarboxylic acids.

8. The composition of claim 1, wherein the organic acid comprises a sulfonic acid.

9. The composition of claim 8, wherein the sulfonic acid comprises methanesulfonic acid.

10. The composition of claim 1, comprising from about two percent by weight to about six percent by weight of the fluxing agent, based on the total weight of the composition.

11. The composition of claim 1, wherein the organic tacking agent comprises a solvent selected from the group consisting of glycerol, mannitol, triethanolamine and combinations comprising at least one of the foregoing solvents.

12. The composition of claim 1, comprising from about 50 percent by weight to about 70 percent by weight of the organic tacking agent, based on the total weight of the composition.

13. The composition of claim 1, wherein the organic wetting agent is selected from the group consisting of 2-propanol, ethylene glycol monobutyl ether, propylene glycol monobutyl ether, propylene glycol monopropyl ether, ethylene glycol monopropyl ether and combinations comprising at least one of the foregoing organic wetting agents.

14. The composition of claim 1, comprising from about one percent by weight to about 45 percent by weight of the organic wetting agent, based on the total weight of the composition.

15. The composition of claim 1, comprising from about ten percent by weight to about 25 percent by weight of the organic wetting agent, based on the total weight of the composition.

16. The composition of claim 1, wherein the organic wetting agent evaporates at a temperature of from about 80° C. to about 170° C.

17. A soldering method for joining objects, the method comprising the steps of:
applying a flux composition, wherein the flux composition leaves a solid washable residue upon completion of a soldering process that can be cleaned with water, and a solder compound to at least a portion of one or more of the objects, the flux composition comprising:
a fluxing agent comprising organic acid, wherein the flux composition comprises from about one percent by weight to about ten percent by weight of the fluxing agent, based on the total weight of the composition;
an organic tacking agent, wherein said organic tacking agent increases the surface tension and viscosity of said flux composition, wherein said viscosity of said flux composition comprises a viscosity value in a range of from about 50 millipascal seconds to about 500 millipascal seconds and said surface tension of said flux composition comprises a surface tension value in a range of about 40 millinewtons per meter to about 200 millinewtons per meter, and wherein the flux composition comprises from about 50 percent by weight to about 99 percent by weight of the organic tacking agent, based on the total weight of the composition;
an organic wetting agent;
water, wherein the water minimizes oxide formation and removes one or more oxides from a solder surface, and wherein the flux composition comprises from about one percent by weight to about five percent by weight water, based on the total weight of the composition;
joining the objects; and
using water to remove one or more oxides from one or more of the joined objects.

18. The method of claim 17, further comprising the step of heating the solder compound to cause a melting of at least a portion thereof.

19. The method of claim 17, wherein the solder compound comprises a metal selected from the group consisting of lead, tin, copper, silver, nickel, gold and combinations comprising at least one of the foregoing metals.

20. The method of claim 17, wherein the solder compound forms solder regions on one or more of the objects.

21. The method of claim 20, wherein the flux composition is applied to the solder regions.

22. The method of claim 17, wherein the flux composition is applied to one or more contact pads present on one or more of the objects.

23. The method of claim 17, wherein the removing step comprises washing residue from one or more of the joined objects.

24. The method of claim 17, wherein at least one of the objects comprises a semiconductor device.

25. The method of claim 17, wherein at least one of the objects comprises a printed circuit board.

26. The method of claim 17, wherein at least one of the objects comprises a semiconductor chip.

27. The method of claim 17, wherein at least one of the objects comprises a chip carrier module.

28. The method of claim 17, wherein the flux composition is applied using an application technique selected from the group consisting of a fluxing wave, a flux spray and combinations comprising at least one of the foregoing application techniques.

29. The method of claim 17, wherein one or more continuous contacts are established between two or more of the objects.

30. A flux composition, wherein the flux composition leaves a solid washable residue upon completion of a soldering process that can be cleaned with water, comprising, based on the total weight of the composition:
from about one percent by weight to about ten percent by weight fluxing agent;
from about 50 percent by weight to about 99 percent by weight or organic tacking agent, wherein said organic tacking agent increases the surface tension and viscosity of said flux composition, wherein said viscosity of said flux composition comprises a viscosity value in a range of from about 50 millipascal seconds to about 500 millipascal seconds and said surface tension of said flux composition comprises a surface tension value in a range of about 40 millinewtons per meter to about 200 millinewtons per meter;
from about one percent by weight to about 45 percent by weight organic wetting agent; and
from about one percent by weight to about five percent by weight water, wherein the water minimizes oxide formation and removes one or more oxides from a solder surface.

* * * * *